United States Patent
Chuang et al.

(10) Patent No.: US 10,626,219 B2
(45) Date of Patent: Apr. 21, 2020

(54) POLYMERS AND RESIN COMPOSITION EMPLOYING THE SAME

(71) Applicant: INDUSTRIAL TECHNOLOGY RESEARCH INSTITUTE, Hsinchu (TW)

(72) Inventors: Kuei-Yi Chuang, Hsinchu (TW); Feng-Po Tseng, Taoyuan (TW); Kuo-Chan Chiou, Tainan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 190 days.

(21) Appl. No.: 15/654,058

(22) Filed: Jul. 19, 2017

(65) Prior Publication Data
US 2018/0134847 A1    May 17, 2018

(30) Foreign Application Priority Data
Nov. 11, 2016 (TW) ............... 105136829 A

(51) Int. Cl.
| | | |
|---|---|---|
| C08G 73/10 | (2006.01) | |
| H05K 1/03 | (2006.01) | |
| B32B 27/20 | (2006.01) | |
| C08K 5/5415 | (2006.01) | |
| C08K 5/5455 | (2006.01) | |
| H01B 3/30 | (2006.01) | |
| H01B 3/40 | (2006.01) | |
| H05K 1/02 | (2006.01) | |
| C08G 77/455 | (2006.01) | |
| C08J 5/24 | (2006.01) | |
| C08L 79/08 | (2006.01) | |
| C08L 83/10 | (2006.01) | |

(52) U.S. Cl.
CPC ............ *C08G 73/106* (2013.01); *B32B 27/20* (2013.01); *C08K 5/5415* (2013.01); *C08K 5/5455* (2013.01); *H01B 3/306* (2013.01); *H01B 3/40* (2013.01); *H05K 1/0346* (2013.01); *H05K 1/0353* (2013.01); *B32B 2307/3065* (2013.01); *H05K 1/024* (2013.01); *H05K 2201/0154* (2013.01); *H05K 2201/0162* (2013.01)

(58) Field of Classification Search
None
See application file for complete search history.

(56) References Cited

U.S. PATENT DOCUMENTS

| | | | |
|---|---|---|---|
| 6,809,130 B2 | 10/2004 | Chiou et al. | |
| 7,138,174 B2 | 11/2006 | Takeuchi et al. | |
| 7,320,830 B2 | 1/2008 | Itou et al. | |
| 8,039,537 B2 | 10/2011 | Tseng et al. | |
| 2002/0106521 A1 | 8/2002 | Hashimoto et al. | |
| 2004/0258899 A1 | 12/2004 | Takeuchi et al. | |
| 2005/0054776 A1 | 3/2005 | Itou et al. | |
| 2005/0181215 A1 | 8/2005 | Suzuki et al. | |
| 2010/0240821 A1* | 9/2010 | Nakamura | C08G 18/603 524/538 |
| 2016/0145373 A1 | 5/2016 | Chuang et al. | |

FOREIGN PATENT DOCUMENTS

| | | |
|---|---|---|
| CN | 101124284 A | 2/2008 |
| CN | 101348575 A | 1/2009 |
| EP | 0 913 429 A2 | 10/1998 |
| JP | 11-130831 A | 5/1999 |

(Continued)

OTHER PUBLICATIONS

Shin-Etsu, "Shin-Etsu Silicon Modified Silicone Fluid," pp. 1-10, 2006 (https://www.shinetsusilicone-global.conn/catalog/pdf/nnodified e.pdf), (Year: 2006).*

(Continued)

*Primary Examiner* — Randy P Gulakowski
*Assistant Examiner* — Ha S Nguyen
(74) *Attorney, Agent, or Firm* — Birch, Stewart, Kolasch & Birch, LLP

(57) ABSTRACT

A polymer is provided. The polymer includes a first repeating unit represented by Formula (I) and a second repeating unit represented by Formula (II):

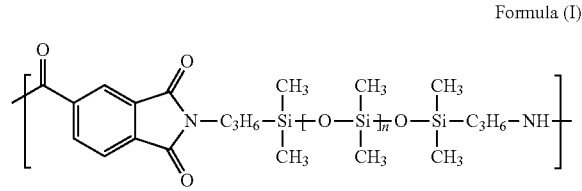

Formula (I)

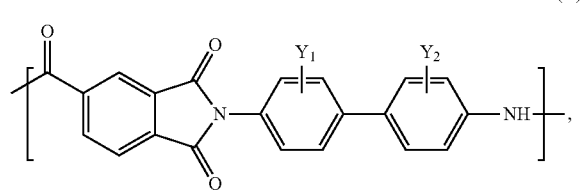

Formula (II)

wherein $Y_1$ and $Y_2$ are independently —H, —$CH_3$, or —$CH_2CH_3$; n is an integer ranging from 1 to 25; and the molar ratio of the first repeating unit to the second repeating unit is from 5:95 to 15:45. A resin composition including the aforementioned polymer is also provided.

12 Claims, No Drawings

(56) References Cited

FOREIGN PATENT DOCUMENTS

| JP | 2004-211055 | A | | 7/2004 | |
|---|---|---|---|---|---|
| JP | 2004211055 | A | * | 7/2004 | |
| JP | -2004315653 | A | * | 11/2004 | |
| JP | 2005-248164 | A | | 9/2005 | |
| JP | -2008103651 | A | * | 5/2008 | |
| JP | 2009-144072 | A | | 7/2009 | |
| JP | 2010-234810 | A | | 10/2010 | |
| JP | 2015-71761 | A | | 4/2015 | |
| TW | I228727 | B | | 3/2005 | |
| TW | 200520639 | A | | 6/2005 | |
| TW | 201127907 | A1 | | 8/2011 | |
| TW | 201317301 | A1 | | 5/2013 | |
| TW | I480329 | B | | 4/2015 | |
| TW | 201619225 | A | | 6/2016 | |
| WO | WO-2012172972 | A1 | * | 12/2012 | ........... C08G 73/106 |

OTHER PUBLICATIONS

Jun Yang et al., "Synthesis and properties of novel benzocyclobutene-functionalized siloxane thermosets", Polymer International, 2013, vol. 62, pp. 1684-1691.

Shunichi Numata et al., "Re-examination of the relationship between packing coefficient and thermal expansion coefficient for aromatic polyimides", Polymer, 1967, vol. 28, pp. 2282-2268.

Shunichi Numata et al., "Thermal expansion coefficients and modull of uniaxially stretched polyimide films with rigid and flexible molecular chains", Polymer, 1989, vol. 30, pp. 1170-1174.

Xiaokun Ma et al., "Preparation and Characterization of Silica/Polyamide-imide Nanocomposite Thin Films", Nanoscale Research Letters, 2010, vol. 5, pp. 1846-1851.

Xiong-Yan Zhao et al., "Review of polymer materials with low dielectric constant", Polymer International, 2010, vol. 59, pp. 597-606.

Taiwanese Notice of Allowance and Search Report for Taiwanese Application No. 105136829, dated Jul. 26, 2017.

Japanese Notification of Reasons for Refusal for Japanese Application No. 2017-215387, dated Aug. 28, 2018, with English translation.

Shin-Etsu Chemical Co., Ltd., "Reactive & Non-Reaction Modified Silicone Fluid," retrieved from URL:https://www.silicone.jp/catalog/pdf/ModifiedSiliconeFluid_J.pdf, Jul. 2006, pp. 1-10.

Japanese Office Action dated Apr. 16, 2019 for Application No. 2017-215387 along with an English translation.

Chinese Office Action for Appl. No. 201611107643.1 dated Oct. 8, 2019.

Lu, Yin-Xiang, et al, "Introduction to Modem Information Materials." Sep. 30, 2006, pp. 198-203.

* cited by examiner

POLYMERS AND RESIN COMPOSITION EMPLOYING THE SAME

CROSS REFERENCE TO RELATED APPLICATIONS

The application is based on, and claims priority from, Taiwan Application Serial Number 105136829, filed on Nov. 11, 2016, the disclosure of which is hereby incorporated by reference herein in its entirety.

TECHNICAL FIELD

The disclosure relates to a polymer and a resin composition employing the polymer.

BACKGROUND

The trend in electronic products has been toward smaller sizes, lighter weights, higher speeds, and higher-frequency transmission. Therefore, the trend is toward high-density printed circuit boards. In order to maintain transmission rate and transmission signal integrity, the ideal materials for use in printed circuit boards have a low dielectric constant (Dk) and a low dissipation factor (Df). Since the signal transmission rate is inversely proportional to the square root of the dielectric constant of the substrate material, a suitable substrate material is apt to have a relatively low dielectric constant. Furthermore, since the dissipation factor is directly proportional to the signal transmission loss, suitable substrate material is apt to have a relatively low dissipation factor in order to maintain transmission signal integrity.

In addition, the need for thermal-resistant and flame-retardant materials for use in semiconductor applications is gradually increasing. For example, electronic materials are classified to comply with the UL 94V-0 standard. Conventional materials in a flame-retardant circuit board are mostly an epoxy resin system. In general, an epoxy resin system employs a sufficient quantity of filler in order to enhance flame retardancy. Due to the great amount of filler, the adhesion between the epoxy resin layer and the copper foil may be decreased, thereby reducing the functionality and degrading the reliability of electronic products.

Accordingly, there is a need for a novel resin composition to meet the requirements of high thermal resistance and low dielectric constant, for high frequency circuit boards.

SUMMARY

An embodiment of the disclosure provides a polymer, wherein the polymer includes a first repeating unit having a structure represented by Formula (I) and a second repeating unit having a structure represented by Formula (II), wherein $Y_1$ and $Y_2$ are independently —H, —$CH_3$, or —$CH_2CH_3$; n is an integer ranging from 1 to 25; and the molar ratio of the first repeating unit to the second repeating unit is from 5:95 to 15:45.

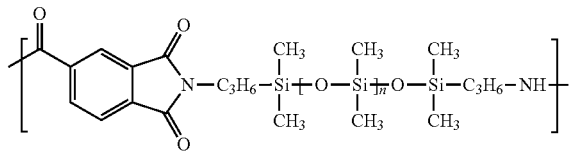

Formula (I)

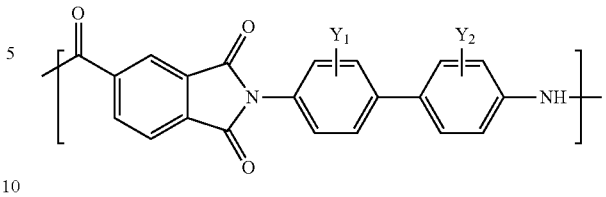

Formula (II)

Another embodiment of the disclosure provides a resin composition. The resin composition includes 100 parts by weight of polymer and 10-70 parts by weight of epoxy resin. The polymer includes a first repeating unit having a structure represented by Formula (I) and a second repeating unit having a structure represented by Formula (II), wherein $Y_1$ and $Y_2$ are independently —H, —$CH_3$, or —$CH_2CH_3$; n is an integer ranging from 1 to 25; and wherein the molar ratio of the first repeating unit to the second repeating unit is from 5:95 to 15:45. The epoxy resin is selected from a group consisting of a compound having a structure represented by Formula (V-I) and a compound having a structure represented by Formula (V-II), wherein $Y_5$ and $Y_6$ are independently —H, —$CH_3$, or —$CH_2CH_3$; Z is —$CH_2$—, —$C(CH_3)_2$—, or —O—; and $Y_7$ is —H, —$CH_3$, or —$CH_2CH_3$.

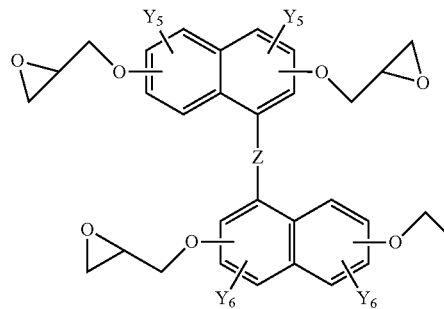

Formula (V-I)

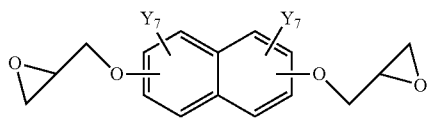

Formula (V-II)

A detailed description is given in the following embodiments.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details.

According to embodiments of the disclosure, the polymer of the disclosure can include a first repeating unit having a structure represented by Formula (I) and a second repeating unit having a structure represented by Formula (II), arranged in a random fashion.

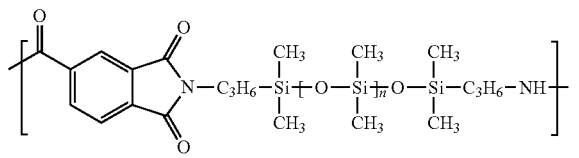

Formula (I)

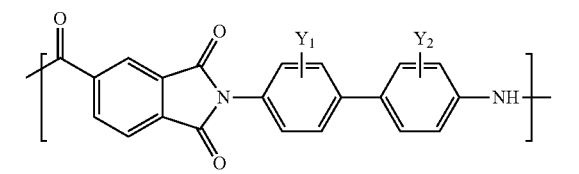

Formula (II)

In Formula (I) and Formula (II), $Y_1$ and $Y_2$ can be independently —H, —$CH_3$, or —$CH_2CH_3$; n can be an integer ranging from 1 to 25; and the molar ratio of the first repeating unit to the second repeating unit is from 5:95 to 15:45.

According to embodiments of the disclosure, in the polymer of the disclosure, there are between 1 and 40 first repeating units and there are between 1 and 40 second repeating units.

According to embodiments of the disclosure, the polymer of the disclosure can have a number average molecular weight of from about 8,000 to about 15,000.

According to embodiments of the disclosure, the polymer of the disclosure can include a first repeating unit having a structure represented by Formula (I), a second repeating unit having a structure represented by Formula (II), and a third repeating unit having a structure represented by Formula (III), arranged in a random fashion.

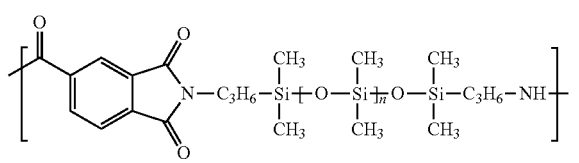

Formula (I)

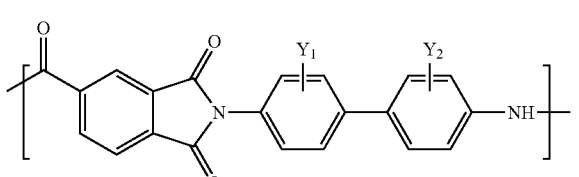

Formula (II)

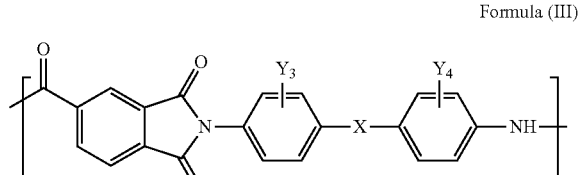

Formula (III)

In the Formula (I), Formula (II), and Formula (III), $Y_1$, $Y_2$, $Y_3$ and $Y_4$ are independently of each other, and can be —H, —$CH_3$, or —$CH_2CH_3$; X can be —$CH_2$—, —$C(CH_3)_2$—, or —O—; n can be an integer ranging from 1 to 25; and the molar ratio between the first repeating unit, the second repeating unit, and the third repeating unit can be from 5:90:5 to 15:45:30.

According to embodiments of the disclosure, in the polymer of the disclosure, there are between 1 and 40 first repeating units; there are between 1 and 40 second repeating units, and there are between 1 and 40 third repeating units.

According to embodiments of the disclosure, the polymer of the disclosure can have a number average molecular weight of from about 8,000 to about 15,000.

According to embodiments of the disclosure, the polymer of the disclosure can include a first repeating unit having a structure represented by Formula (I), a second repeating unit having a structure represented by Formula (II), a third repeating unit having a structure represented by Formula (III), and a fourth repeating unit having a structure represented by Formula (IV), arranged in a random fashion.

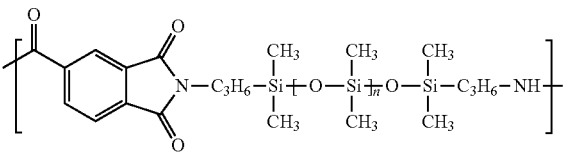

Formula (I)

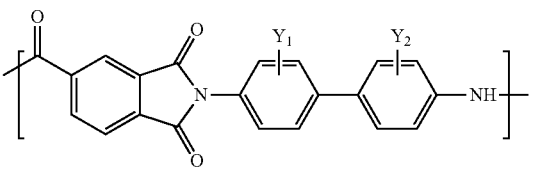

Formula (II)

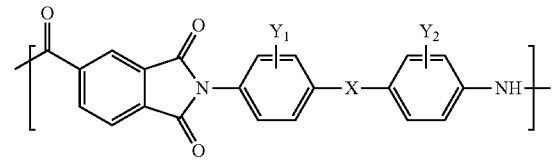

Formula (III)

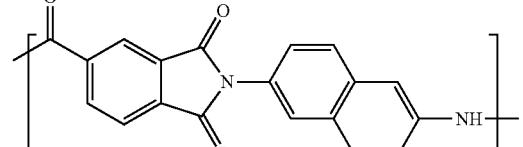

Formula (IV)

In the Formula (I), Formula (II), and Formula (III), $Y_1$, $Y_2$, $Y_3$ and $Y_4$ are independently of each other, and can be —H, —$CH_3$, or —$CH_2CH_3$; X can be —$CH_2$—, —$C(CH_3)_2$—, or —O—; n can be an integer ranging from 1 to 25; and the molar ratio between the first repeating unit, the second repeating unit, the third repeating unit and the fourth repeating unit can be from 5:85:5:5 to 15:45:30:10.

According to embodiments of the disclosure, in the polymer of the disclosure, there are between 1 and 40 first repeating units; there are between 1 and 40 second repeating units; there are between 1 and 40 third repeating units; and there are between 1 and 40 fourth repeating units.

According to embodiments of the disclosure, the polymer of the disclosure can have a number average molecular weight of from about 8,000 to about 15,000.

According to embodiments of the disclosure, the resin composition of the disclosure can include 100 parts by weight of the aforementioned polymer and 10-70 parts by weight of epoxy resin. The epoxy resin can be selected from a group consisting of a compound having a structure represented by Formula (V-I) and a compound having a structure represented by Formula (V-II)

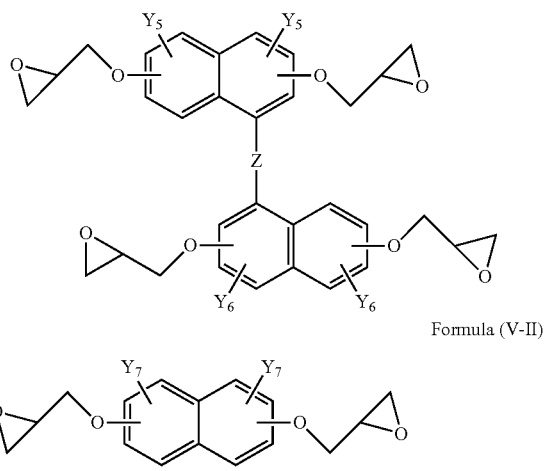

Formula (V-I)

Formula (V-II)

In Formula (V-I) and Formula (V-II), $Y_5$, $Y_6$ and $Y_7$ are independently of each other, and can be —H, —$CH_3$, or —$CH_2CH_3$; and Z can be —$CH_2$—, —$C(CH_3)_2$—, or —O—.

According to embodiments of the disclosure, the polymer of the resin composition of the disclosure can include a first repeating unit having a structure represented by Formula (I) and a second repeating unit having a structure represented by Formula (II), arranged in a random fashion.

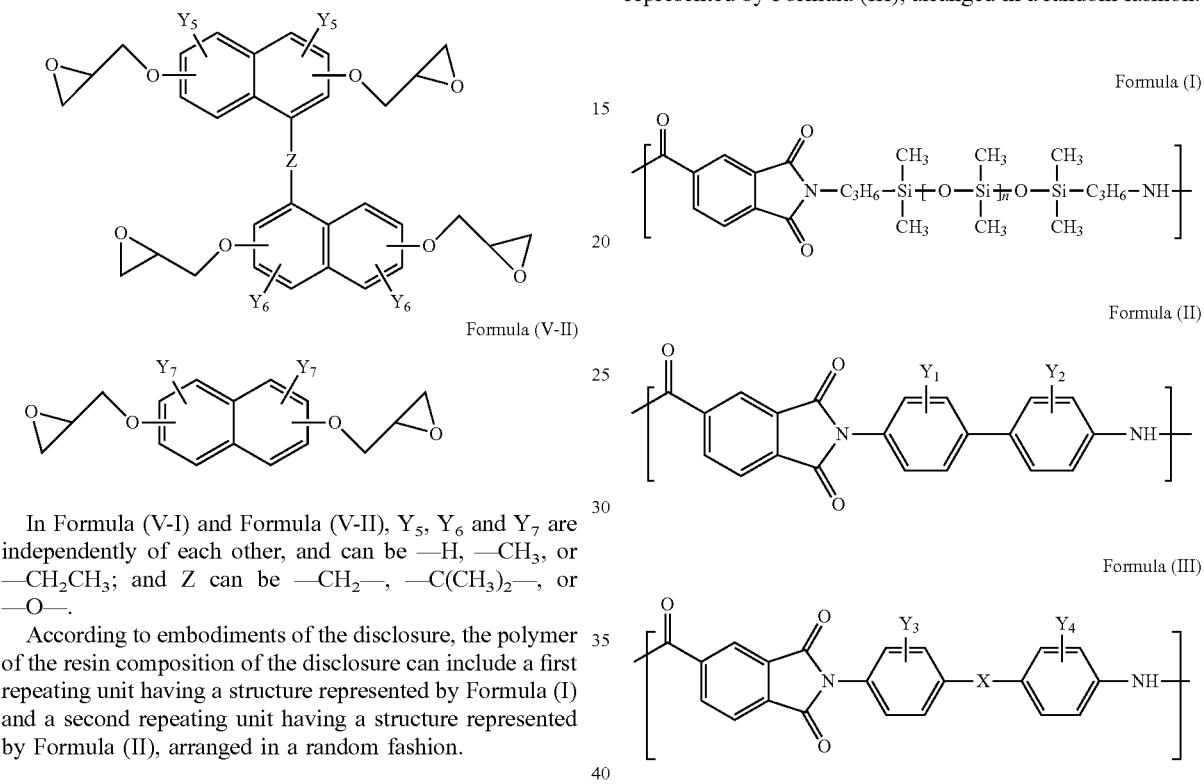

Formula (I)

Formula (II)

In Formula (I) and Formula (II), $Y_1$ and $Y_2$ are independently of each other, and can be —H, —$CH_3$, or —$CH_2CH_3$; n can be an integer ranging from 1 to 25; and the molar ratio of the first repeating unit to the second repeating unit is from 5:95 to 15:45.

According to embodiments of the disclosure, in the polymer of the resin composition of the disclosure, there are between 1 and 40 first repeating units and there are between 1 and 40 second repeating units.

According to embodiments of the disclosure, the polymer of the resin composition of the disclosure can have a number average molecular weight of from about 8,000 to about 15,000.

According to embodiments of the disclosure, the polymer of the resin composition of the disclosure can include a first repeating unit having a structure represented by Formula (I), a second repeating unit having a structure represented by Formula (II), and a third repeating unit having a structure represented by Formula (III), arranged in a random fashion.

Formula (I)

Formula (II)

Formula (III)

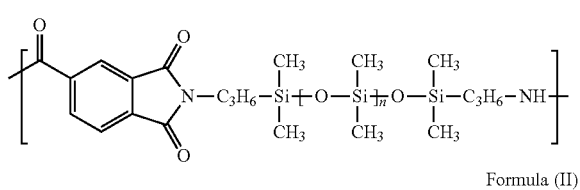

In the Formula (I), Formula (II), and Formula (III), $Y_1$, $Y_2$, $Y_3$ and $Y_4$ are independently of each other, and can be —H, —$CH_3$, or —$CH_2CH_3$; X can be —$CH_2$—, —$C(CH_3)_2$—, or —O—; n can be an integer ranging from 1 to 25; and the molar ratio between the first repeating unit, the second repeating unit, and the third repeating unit can be from 5:90:5 to 15:45:30.

According to embodiments of the disclosure, in the polymer of the resin composition of the disclosure, there are between 1 and 40 first repeating units; there are between 1 and 40 second repeating units; and there are between 1 and 40 third repeating units.

According to embodiments of the disclosure, the polymer of the resin composition of the disclosure can have a number average molecular weight of from about 8,000 to about 15,000.

According to embodiments of the disclosure, the polymer of the resin composition of the disclosure can include a first repeating unit having a structure represented by Formula (I), a second repeating unit having a structure represented by Formula (II), a third repeating unit having a structure represented by Formula (III), and a fourth repeating unit having a structure represented by Formula (IV), arranged in a random fashion.

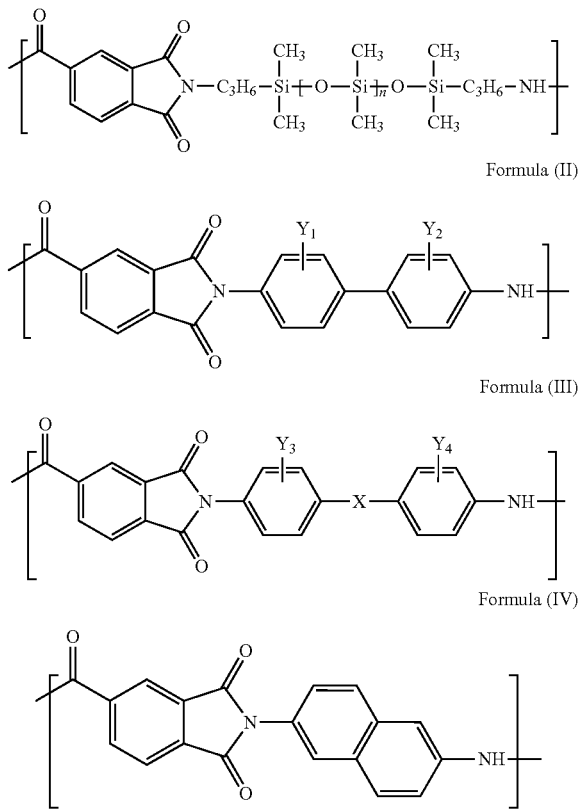

Formula (I)

Formula (II)

Formula (III)

Formula (IV)

In the Formula (I), Formula (II), and Formula (III), $Y_1$, $Y_2$, $Y_3$ and $Y_4$ are independently of each other, and can be —H, —CH$_3$, or —CH$_2$CH$_3$; X can be —CH$_2$—, —C(CH$_3$)$_2$—, or —O—; n can be an integer ranging from 1 to 25; and the molar ratio between the first repeating unit, the second repeating unit, the third repeating unit, and the fourth repeating unit can be from 5:85:5:5 to 15:45:30:10.

According to embodiments of the disclosure, in the polymer of the resin composition of the disclosure, there are between 1 and 40 first repeating units; there are between 1 and 40 second repeating units; there are between 1 and 40 third repeating units; and there are between 1 and 40 fourth repeating units.

According to embodiments of the disclosure, the polymer of the resin composition of the disclosure can have a number average molecular weight of from about 8,000 to about 15,000.

According to embodiments of the disclosure, the resin composition of the disclosure may additionally include a solvent. The choice of the solvent is unlimited and the solvent can be selected corresponding to the polymer and the epoxy resin. For example, the solvent can be acetone, methyl ethyl ketone, 1-methoxy-2-propanol, 1,2-Propanediol monomethyl ether acetate, toluene, xylene, dimethylformamide (DMF), dimethylacetamide (DMAc), N-methyl-2-pyrrolidone (NMP), dimethyl sulfoxide (DMSO) or a combination thereof.

According to embodiments of the disclosure, the resin composition of the disclosure may further include an inorganic powder, wherein the inorganic powder can be present in an amount equal to or less than 50 parts by weight. The inorganic powder of the disclosure can be silicon oxide, aluminum oxide, magnesium oxide or a combination thereof. The inorganic powder can have an average particle size from about 5 μm to 12 μm.

Below, exemplary embodiments are described in detail so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout

EXAMPLES

The equipment and method for measuring the characteristics of the products disclosed in following Examples are listed below:

Tg: glass transition temperature.

Td5%: 5% thermal decomposition temperature.

xy-CTE: The coefficient of thermal expansion in both the X and Y directions (xy-CTE) was determined by thermal mechanical analyzer (TMA) (TA Instrument, model Q400) according to IPC-TM-650.2.4.24 standard test.

Dk: dielectric constant (abbreviated as Dk in the PCB (printed circuit board) field).

Df: dissipation factor (abbreviated as Df in the PCB (printed circuit board) field).

Number average molecular weight: the number average molecular weight of polymer was determined by Gel permeation chromatography (GPC) sold by TAIAN TECH.

The chemicals used in the Examples and Comparative Examples were obtained from the following sources.

TMA: trimellitic anhydride, available from Fu-Pao Chemical Co.

PMDA: pyromellitic dianhydride.

TODI: bitolylene diisocyanate, available from Char-Deng agent.

MDI: methylene diphenyl isocyanate, available from Fu-Pao Chemical Co.

NDI: 2,6-naphthalene diisocyanate, available from Char-Deng agent.

X-22-161A (with a weight-average molecular weight of about 850), X-22-161B (with a weight-average molecular weight of about 1000) and KF-8012 (with a weight-average molecular weight of about 5000), available from Shin-Etsu Chemical Co., Ltd.

Epoxy resin HP-4032D: naphthalene type epoxy, available from DIC Corporation.

Epoxy resin 6000: naphthalene type epoxy, available from DIC Corporation.

Epoxy resin 828: bisphenol A type epoxy, available from Changchun resin Corporation.

Epoxy resin 202: novolac resin, available from Chang-Yi agent.

Silicon dioxide: having an average particle size of about 12 μm, available from Tatsumori LTD.

Polymer Preparation

Example 1

100 g of TMA, 129 g of TODI, 21 g of X-22-161A, and 676 g of dimethylacetamide (DMAc) (as solvent) were added to a 1,000 ml three-neck glass reactor and uniformly stirred using a two-impeller stir bar at 90-150° C. After reacting completely, the reactor was cooled to room temperature, obtaining a solution including Polymer (A1) having a number average molecular weight of about 9,000. The reactants and characteristics of Polymer (A1) are shown in Table 1.

Polymer (A1) was analyzed by infrared (IR) spectrophotometry and the result is shown below: 3330 cm$^{-1}$ (absorption peak of —NH), 1775 cm$^{-1}$ and 1713 cm$^{-1}$ (absorption peak of —(CO)$_2$NH), 1258 cm$^{-1}$ (absorption peak of —Si—CH$_3$), and 1080 cm$^{-1}$ (absorption peak of Si—O—Si).

Example 2

100 g of TMA, 129 g of TODI, 39 g of X-22-161B, and 725 g of dimethylacetamide (DMAc) (as solvent) were added to a 1,000 ml three-neck glass reactor and uniformly stirred using a two-impeller stir bar at 90-150° C. After reacting completely, the reactor was cooled to room temperature, obtaining a solution including Polymer (A2) having a number average molecular weight of about 11,000. The reactants and characteristics of Polymer (A2) are shown in Table 1.

Polymer (A2) was analyzed by infrared (IR) spectrophotometry and the result is shown below: 3330 cm$^{-1}$ (absorption peak of —NH), 1775 cm$^{-1}$ and 1713 cm$^{-1}$ (absorption peak of —(CO$_2$NH), 1258 cm$^{-1}$ (Absorption peak of —Si—CH$_3$), and 1080 cm$^{-1}$ (Absorption peak of —Si—O—Si).

Example 3

100 g of TMA, 98 g of TODI, 30 g of MDI, 21 g of X-22-161A, and 673 g of dimethylacetamide (DMAc) (as solvent) were added to a 1,000 ml three-neck glass reactor and uniformly stirred using a two-impeller stir bar at 90-150° C. After reacting completely, the reactor was cooled to room temperature, obtaining a solution including Polymer (A3) having a number average molecular weight of about 9,200. The reactants and characteristics of Polymer (A3) are shown in Table 1.

Polymer (A3) was analyzed by infrared (IR) spectrophotometry and the result is shown below: 3330 cm$^{-1}$ (absorption peak of —NH), 1775 cm$^{-1}$ and 1713 cm$^{-1}$ (absorption peak of —(CO)$_2$NH), 1258 cm$^{-1}$ (Absorption peak of —Si—CH$_3$), and 1080 cm$^{-1}$ (Absorption peak of —Si—O—Si).

Example 4

100 g of TMA, 98 g of TODI, 30 g of MDI, 39 g of X-22-161B, and 725 g of dimethylacetamide (DMAc) (as solvent) were added to a 1,000 ml three-neck glass reactor and uniformly stirred using a two-impeller stir bar at 90-150° C. After reacting completely, the reactor was cooled to room temperature, obtaining a solution including Polymer (A4) having a number average molecular weight of about 10,500. The reactants and characteristics of Polymer (A4) are shown in Table 1.

Polymer (A4) was analyzed by infrared (IR) spectrophotometry and the result is shown below: 3330 cm$^{-1}$ (absorption peak of —NH), 1775 cm$^{-1}$ and 1713 cm$^{-1}$ (absorption peak of —(CO$_2$NH), 1258 cm$^{-1}$ (Absorption peak of —Si—CH$_3$), and 1080 cm$^{-1}$ (Absorption peak of —Si—O—Si).

Example 5

100 g of TMA, 81 g of TODI, 52 g of MDI, 21 g of X-22-161A, and 687 g of dimethylacetamide (DMAc) (as solvent) were added to a 1,000 ml three-neck glass reactor and uniformly stirred using a two-impeller stir bar at 90-150° C. After reacting completely, the reactor was cooled to room temperature, obtaining a solution including Polymer (A5) having a number average molecular weight of about 9,100. The reactants and characteristics of Polymer (A5) are shown in Table 1.

Polymer (A5) was analyzed by infrared (IR) spectrophotometry and the result is shown below: 3330 cm$^{-1}$ (absorption peak of —NH), 1775 cm$^{-1}$ and 1713 cm$^{-1}$ (absorption peak of —(CO$_2$NH), 1258 cm$^{-1}$ (Absorption peak of —Si—CH$_3$), and 1080 cm$^{-1}$ (Absorption peak of —Si—O—Si).

Example 6

100 g of TMA, 81 g of TODI, 52 g of MDI, 39 g of X-22-161B, and 735 g of dimethylacetamide (DMAc) (as solvent) were added to a 1,000 ml three-neck glass reactor and uniformly stirred using a two-impeller stir bar at 90-150° C. After reacting completely, the reactor was cooled to room temperature, obtaining a solution including Polymer (A6) having a number average molecular weight of about 12,000. The reactants and characteristics of Polymer (A6) are shown in Table 1.

Polymer (A6) was analyzed by infrared (IR) spectrophotometry and the result is shown below: 3330 cm$^{-1}$ (absorption peak of —NH), 1775 cm$^{-1}$ and 1713 cm$^{-1}$ (absorption peak of —(CO$_2$NH), 1258 cm$^{-1}$ (Absorption peak of —Si—CH$_3$), and 1080 cm$^{-1}$ (Absorption peak of —Si—O—Si).

Example 7

100 g of TMA, 91 g of TODI, 30 g of MDI, 41 g of X-22-161A, and 708 g of dimethylacetamide (DMAc) (as solvent) were added to a 1,000 ml three-neck glass reactor and uniformly stirred using a two-impeller stir bar at 90-150° C. After reacting completely, the reactor was cooled to room temperature, obtaining a solution including Polymer (A7) having a number average molecular weight of about 9,350. The reactants and characteristics of Polymer (A7) are shown in Table 1.

Polymer (A7) was analyzed by infrared (IR) spectrophotometry and the result is shown below: 3330 cm$^{-1}$ (absorption peak of —NH), 1775 cm$^{-1}$ and 1713 cm$^{-1}$ (absorption peak of —(CO)$_2$NH), 1258 cm$^{-1}$ (Absorption peak of —Si—CH$_3$), and 1080 cm$^{-1}$ (Absorption peak of —Si—O—Si).

Example 8

95 g of TMA, 6 g of PMDA, 98 g of TODI, 30 g of MDI, 21 g of X-22-161A, and 673 g of dimethylacetamide (DMAc) (as solvent) were added to a 1,000 ml three-neck glass reactor and uniformly stirred using a two-impeller stir bar at 90-150° C. After reacting completely, the reactor was cooled to room temperature, obtaining a solution including Polymer (A8) having a number average molecular weight of about 9,210. The reactants and characteristics of Polymer (A8) are shown in Table 1.

Polymer (A8) was analyzed by infrared (IR) spectrophotometry and the result is shown below: 3330 cm$^{-1}$ (absorption peak of —NH), 1775 cm$^{-1}$ and 1713 cm$^{-1}$ (absorption peak of —(CO$_2$NH), 1258 cm$^{-1}$ (Absorption peak of —Si—CH$_3$), and 1080 cm$^{-1}$ (Absorption peak of —Si—O—Si).

Example 9

90 g of TMA, 11 g of PMDA, 98 g of TODI, 30 g of MDI, 21 g of X-22-161A, and 673 g of dimethylacetamide (DMAc) (as solvent) were added to a 1,000 ml three-neck glass reactor and uniformly stirred using a two-impeller stir bar at 90-150° C. After reacting completely, the reactor was cooled to room temperature, obtaining a solution including Polymer (A9) having a number average molecular weight of about 9,480. The reactants and characteristics of Polymer (A9) are shown in Table 2.

Polymer (A9) was analyzed by infrared (IR) spectrophotometry and the result is shown below: 3330 cm$^{-1}$ (absorption peak of —NH), 1775 cm$^{-1}$ and 1713 cm$^{-1}$ (absorption peak of —(CO)$_2$NH), 1258 cm$^{-1}$ (Absorption peak of —Si—CH$_3$), and 1080 cm$^{-1}$ (Absorption peak of —Si—O—Si).

Example 10

100 g of TMA, 70 g of TODI, 30 g of MDI, 22 g of NDI, 21 g of X-22-161A, and 657 g of dimethylacetamide (DMAc) (as solvent) were added to a 1,000 ml three-neck glass reactor and uniformly stirred using a two-impeller stir bar at 90-150° C. After reacting completely, the reactor was cooled to room temperature, obtaining a solution including Polymer (A10) having a number average molecular weight of about 9,520. The reactants and characteristics of Polymer (A10) are shown in Table 2.

Polymer (A10) was analyzed by infrared (IR) spectrophotometry and the result is shown below: 3330 cm$^{-1}$ (absorption peak of —NH), 1775 cm$^{-1}$ and 1713 cm$^{-1}$ (absorption peak of —(CO)$_2$NH), 1258 cm$^{-1}$ (Absorption peak of —Si—CH$_3$), and 1080 cm$^{-1}$ (Absorption peak of —Si—O—Si).

Comparative Example 1

100 g of TMA, 104 g of TODI, 30 g of MDI, and 632 g of dimethylacetamide (DMAc) (as solvent) were added to a 1,000 ml three-neck glass reactor and uniformly stirred using a two-impeller stir bar at 90-150° C. After reacting completely, the reactor was cooled to room temperature, obtaining a solution including Polymer (A11). The reactants and characteristics of Polymer (A11) are shown in Table 2.

Comparative Example 2

100 g of TMA, 47 g of TODI, 78 g of MDI, 21 g of X-22-161A, and 665 g of dimethylacetamide (DMAc) (as solvent) were added to a 1,000 ml three-neck glass reactor and uniformly stirred using a two-impeller stir bar at 90-150° C. After reacting completely, the reactor was cooled to room temperature, obtaining a solution including Polymer (A12). The reactants and characteristics of Polymer (A12) are shown in Table 2.

Comparative Example 3

100 g of TMA, 77 g of TODI, 30 g of MDI, 83 g of X-22-161A, and 784 g of dimethylacetamide (DMAc) (as solvent) were added to a 1,000 ml three-neck glass reactor and uniformly stirred using a two-impeller stir bar at 90-150° C. After reacting completely, the reactor was cooled to room temperature, obtaining a solution including Polymer (A13). The reactants and characteristics of Polymer (A13) are shown in Table 2.

Comparative Example 4

100 g of TMA, 77 g of TODI, 30 g of MDI, 155 g of X-22-161B, and 978 g of dimethylacetamide (DMAc) (as solvent) were added to a 1,000 ml three-neck glass reactor and uniformly stirred using a two-impeller stir bar at 90-150° C. After reacting completely, the reactor was cooled to room temperature, obtaining a solution including Polymer (A14). The reactants and characteristics of Polymer (A14) are shown in Table 2.

Comparative Example 5

80 g of TMA, 23 g of PMDA, 98 g of TODI, 30 g of MDI, 21 g of X-22-161A, and 740 g of dimethylacetamide (DMAc) (as solvent) were added to a 1,000 ml three-neck glass reactor and uniformly stirred using a two-impeller stir bar at 90-150° C. After reacting completely, the reactor was cooled to room temperature, obtaining a solution including Polymer (A15). The reactants and characteristics of Polymer (A15) are shown in Table 2.

Comparative Example 6

100 g of TMA, 98 g of TODI, 30 g of MDI, 21 g of X-22-161A, 57 g of KF-8012, and 740 g of dimethylacetamide (DMAc) (as solvent) were added to a 1,000 ml three-neck glass reactor and uniformly stirred using a two-impeller stir bar at 90-150° C. After reacting completely, the reactor was cooled to room temperature, obtaining a solution including Polymer (A16). The reactants and characteristics of Polymer (A16) are shown in Table 2.

TABLE 1

| | | | Example 1 | Example 2 | Example 3 | Example 4 | Example 5 | Example 6 | Example 7 | Example 8 |
|---|---|---|---|---|---|---|---|---|---|---|
| Reactant | acid anhydride | TMA | 100 g | 100 g | 100 g | 100 g | 100 g | 100 g | 100 g | 95 g |
| | | PMDA | — | — | — | — | — | — | — | 6 g |
| | isocyanate | TODI | 129 g | 129 g | 98 g | 98 g | 81 g | 81 g | 91 g | 98 g |
| | | MDI | — | — | 30 g | 30 g | 52 g | 52 g | 30 g | 30 g |
| | | NDI | — | — | — | — | — | — | — | — |
| | siloxane compound | X-22-161A | 21 g | — | 21 g | — | 21 g | — | 41 g | 21 g |
| | | X-22-161B | — | 39 g | — | 39 g | — | 39 g | — | — |
| DMAc (solvent) | | | 676 | 725 | 673 | 725 | 687 | 735 | 708 | 673 |
| product | | polymer | A1 | A2 | A3 | A4 | A5 | A6 | A7 | A8 |
| | | m1/m2/m3/m4 (molar ratio*) | 5/95/0/0 | 5/95/0/0 | 5/72/23/0 | 5/72/23/0 | 5/55/40/0 | 5/55/40/0 | 10/67/23/0 | 5/72/23/0 |
| characteristics | | Tg (° C.) | 275 | 270 | 266 | 260 | 254 | 248 | 235 | 268 |
| | | Td5% (° C.) | 435 | 431 | 428 | 422 | 411 | 416 | 441 | 436 |
| | | xy-CTE (ppm/° C.) | 15 | 13 | 18 | 16 | 25 | 21 | 16 | 6 |

TABLE 1-continued

|  | Example 1 | Example 2 | Example 3 | Example 4 | Example 5 | Example 6 | Example 7 | Example 8 |
|---|---|---|---|---|---|---|---|---|
| Dk | 3.3 | 3.25 | 3.41 | 3.37 | 3.5 | 3.48 | 3.21 | 3.07 |
| Df | 0.019 | 0.019 | 0.013 | 0.011 | 0.018 | 0.017 | 0.0091 | 0.0088 |

*molar ratio "m1/m2/m3/m4" means the ratio between the number of first repeating unit, the number of second repeating unit, the number of third repeating unit, and the number of fourth repeating unit.

TABLE 2

|  |  |  | Example 9 | Example 10 | Comparative Example 1 | Comparative Example 2 | Comparative Example 3 | Comparative Example 4 | Comparative Example 5 | Comparative Example 6 |
|---|---|---|---|---|---|---|---|---|---|---|
| Reactant | acid anhydride | TMA | 90 g | 100 g | 100 g | 100 g | 100 g | 100 g | 80 g | 100 g |
|  |  | PMDA | 11 g | — | — | — | — | — | 23 g | — |
|  | isocyanate | TODI | 98 g | 70 g | 104 g | 47 g | 77 g | 77 g | 98 g | 98 g |
|  |  | MDI | 30 g | 30 g | 30 g | 78 g | 30 g | 30 g | 30 g | 30 g |
|  |  | NDI | — | 22 g | — | — | — | — | — | — |
|  | siloxane compound | X-22-161A | 21 g | 21 g | — | 21 g | 83 g | — | 21 g | 21 g |
|  |  | X-22-161B | — | — | — | — | — | 155 g | — | — |
|  |  | KF-8012 | — | — | — | — | — | — | — | 57 g |
| DMAc (solvent) |  |  | 673 | 657 | 632 | 665 | 784 | 978 | 740 | 740 |
| product |  | polymer | A9 | A10 | A11 | A12 | A13 | A14 | A15 | A16 |
|  |  | m1/m2/m3/m4 (molar ratio) | 5/72/23/0 | 5/62/23/10 | 0/78/22/0 | 5/35/60/0 | 20/57/23/0 | 20/57/23/0 | 5/72/23/0 | 5/72/23/0 |
| characteristics |  | Tg (° C.) | 261 | 263 | 278 | 268 | — | — | — | — |
|  |  | Td5%(° C.) | 438 | 425 | 420 | 401 | — | — | — | — |
|  |  | xy-CTE (ppm/° C.) | 4 | 17 | 30 | 56 | — | — | — | — |
|  |  | Dk | 3.01 | 3.37 | 3.6 | 3.8 | — | — | — | — |
|  |  | Df | 0.0088 | 0.011 | 0.029 | 0.021 | — | — | — | — |

As shown in Table 1 and Table 2, due to the specific amounts of the acid anhydride, isocyanate and siloxane compound, the polymer of the disclosure exhibits low dielectric constant and low coefficient of thermal expansion.

Polymers (A11) and (A12) prepared from Comparative Examples 1 and 2 exhibit relatively high dielectric constant and coefficient of thermal expansion in comparison with the polymer prepared from Examples of the disclosure. Due to the high viscosity, the characteristics of Polymers (A13)-(A15) prepared from Comparative Examples 3-5 cannot be measured. Since solid particles were formed after the preparation of Polymer (A16) prepared from Comparative Example 6, the characteristics of Polymer (A16) prepared from Comparative Example 6 cannot be measured.

Preparation of Resin Composition

Example 11

The solution including 80 parts by weight of polymer (A3) and 20 parts by weight of epoxy resin HP-4032D was added into the reaction bottle. After stirring, Resin composition (I) was obtained. The components and characteristics of Resin composition (I) are shown in Table 3.

Example 12

The solution including 60 parts by weight of polymer (A3) and 40 parts by weight of epoxy resin HP-4032D was added into the reaction bottle. After stirring, Resin composition (II) was obtained. The components and characteristics of Resin composition (II) are shown in Table 3.

Example 13

The solution including 60 parts by weight of polymer (A3) and 40 parts by weight of epoxy resin 6000 was added into the reaction bottle. After stirring, Resin composition (III) was obtained. The components and characteristics of Resin composition (III) are shown in Table 3.

Example 14

The solution including 80 parts by weight of polymer (A9) and 20 parts by weight of epoxy resin HP-4032D was added into the reaction bottle. After stirring, Resin composition (IV) was obtained. The components and characteristics of Resin composition (IV) are shown in Table 3.

Example 15

The solution including 60 parts by weight of polymer (A9) and 40 parts by weight of epoxy resin HP-4032D was added into the reaction bottle. After stirring, Resin composition (V) was obtained. The components and characteristics of Resin composition (V) are shown in Table 3.

Comparative Example 7

The solution including 40 parts by weight of polymer (A3) and 60 parts by weight of epoxy resin HP-4032D was added into the reaction bottle. After stirring, Resin composition (VI) was obtained. The components and characteristics of Resin composition (VI) are shown in Table 3.

Comparative Example 8

The solution including 60 parts by weight of polymer (A3) and 40 parts by weight of epoxy resin 828 was added into the reaction bottle. After stirring, Resin composition (VII) was obtained. The components and characteristics of Resin composition (VII) are shown in Table 3.

Comparative Example 9

The solution including 60 parts by weight of polymer (A3) and 40 parts by weight of epoxy resin 202 was added into the reaction bottle. After stirring, Resin composition (VIII) was obtained. The components and characteristics of Resin composition (VIII) are shown in Table 3.

Example 16

The solution including 60 parts by weight of polymer (A3) and 40 parts by weight of epoxy resin HP-4032D was added into the reaction bottle. Next, 10 parts by weight of silicon dioxide was added into the reaction bottle. After grinding and stirring, Resin composition (IX) was obtained. The components and characteristics of Resin composition (IX) are shown in Table4.

Example 17

The solution including 60 parts by weight of polymer (A3) and 40 parts by weight of epoxy resin HP-4032D was added into the reaction bottle. Next, 30 parts by weight of silicon dioxide was added into the reaction bottle. After grinding and stirring, Resin composition (X) was obtained. The components and characteristics of Resin composition (X) are shown in Table 4.

Example 18

The solution including 60 parts by weight of polymer (A9) and 40 parts by weight of epoxy resin HP-4032D were added into the reaction bottle. Next, 10 parts by weight of silicon dioxide was added into the reaction bottle. After grinding and stirring, Resin composition (XI) was obtained. The components and characteristics of Resin composition (XI) are shown in Table 4.

Example 19

The solution including 60 parts by weight of polymer (A9) and 40 parts by weight of epoxy resin HP-4032D were added into the reaction bottle. Next, 30 parts by weight of silicon dioxide was added into the reaction bottle. After grinding and stirring, Resin composition (XII) was obtained. The components and characteristics of Resin composition (XII) are shown in Table 4.

Preparation of Composite Material

Example 20

The solution including 60 parts by weight of polymer (A3) and 40 parts by weight of epoxy resin HP-4032D was added into the reaction bottle. Next, 10 parts by weight of silicon dioxide was added into the reaction bottle. After grinding and stirring, a resin composition was obtained. Next, a glass fiber cloth was immersed in the resin composition. After laminating, heating at 200° C., and pressurizing for 3 hr, Composite material (I) was obtained. The components and characteristics of Composite material (I) are shown in Table 4.

Example 21

The solution including 60 parts by weight of polymer (A3) and 40 parts by weight of epoxy resin HP-4032D were added into the reaction bottle. Next, 30 parts by weight of silicon dioxide was added into the reaction bottle. After grinding and stirring, a resin composition was obtained. Next, a glass fiber cloth was immersed in the resin composition. After laminating, heating at 200° C., and pressurizing for 3 hr, Composite material (II) was obtained. The components and characteristics of Composite material (II) are shown in Table 4.

Example 22

The solution including 60 parts by weight of polymer (A9) and 40 parts by weight of epoxy resin HP-4032D were added into the reaction bottle. Next, 10 parts by weight of silicon dioxide was added into the reaction bottle. After grinding and stirring, a resin composition was obtained. Next, a glass fiber cloth was immersed in the resin composition. After laminating, heating at 200° C., and pressurizing for 3 hr, Composite material (III) was obtained. The components and characteristics of Composite material (III) are shown in Table 4.

Example 23

The solution including 60 parts by weight of polymer (A9) and 40 parts by weight of epoxy resin HP-4032D were added into the reaction bottle. Next, 30 parts by weight of silicon dioxide was added into the reaction bottle. After grinding and stirring, a resin composition was obtained. Next, a glass fiber cloth was immersed in the resin composition. After laminating, heating at 200° C., and pressurizing for 3 hr, Composite material (IV) was obtained. The components and characteristics of Composite material (IV) are shown in Table 4.

TABLE 3

| | | | Example 11 | Example 12 | Example 13 | Example 14 | Example 15 | Comparative Example 7 | Comparative Example 8 | Comparative Example 9 |
|---|---|---|---|---|---|---|---|---|---|---|
| component | polymer | A3 | 80 | 60 | 60 | — | — | 40 | 60 | 60 |
| | | A9 | — | — | — | 80 | 60 | — | — | — |
| | epoxy resin | HP-4032D | 20 | 40 | — | 20 | 40 | 60 | — | — |
| | | 6000 | — | — | 40 | — | — | — | — | — |
| | | 828 | — | — | — | — | — | — | 40 | — |
| | | 202 | — | — | — | — | — | — | — | 40 |
| | filler | SiO2 | — | — | — | — | — | — | — | — |
| characteristics | | Tg (° C.) | 237 | 215 | 219 | 242 | 225 | 186 | 190 | 178 |
| | | Td5%(° C.) | 415 | 402 | 405 | 422 | 412 | 378 | 385 | 377 |
| | | xy-CTE (ppm/° C.) | 22 | 25 | 26 | 9 | 12 | 42 | 48 | 53 |

TABLE 3-continued

|  |  | Example 11 | Example 12 | Example 13 | Example 14 | Example 15 | Comparative Example 7 | Comparative Example 8 | Comparative Example 9 |
|---|---|---|---|---|---|---|---|---|---|
|  | Dk | 3.45 | 3.5 | 3.51 | 3.15 | 3.22 | 4.12 | 3.91 | 4.03 |
|  | Df | 0.011 | 0.012 | 0.014 | 0.010 | 0.013 | 0.024 | 0.018 | 0.022 |

TABLE 4

| | | | Example 16 | Example 17 | Example 18 | Example 19 | Example 20 | Example 21 | Example 22 | Example 23 |
|---|---|---|---|---|---|---|---|---|---|---|
| component | polymer | A3 | 60 | 60 | — | — | 60 | 60 | — | — |
|  |  | A9 | — | — | 60 | 60 | — | — | 60 | 60 |
|  | epoxy resin | HP-4032D | 40 | 40 | 40 | 40 | 40 | 40 | 40 | 40 |
|  |  | 6000 | — | — | — | — | — | — | — | — |
|  |  | 828 | — | — | — | — | — | — | — | — |
|  |  | 202 | — | — | — | — | — | — | — | — |
|  | filler | SiO2 | 10 | 30 | 10 | 30 | 10 | 30 | 10 | 30 |
| substrate |  | glass fiber cloth | — | — | — | — | ○ | ○ | ○ | ○ |
| characteristics |  | Tg (° C.) | 215 | 218 | 231 | 235 | 216 | 228 | 218 | 231 |
|  |  | Td5% (° C.) | 409 | 410 | 417 | 422 | 408 | 415 | 411 | 420 |
|  |  | xy-CTE (ppm/° C.) | 18 | 9 | 10 | 6 | 17 | 8 | 7 | 4 |
|  |  | Dk | 3.45 | 3.02 | 3.12 | 3.05 | 3.43 | 3.17 | 3.01 | 2.98 |
|  |  | Df | 0.013 | 0.011 | 0.014 | 0.010 | 0.012 | 0.010 | 0.0091 | 0.0089 |

It will be clear that various modifications and variations can be made to the disclosed methods and materials. It is intended that the specification and examples be considered as exemplary only, with the true scope of the disclosure being indicated by the following claims and their equivalents.

What is claimed is:

1. A polymer, which comprises a first repeating unit having a structure represented by Formula (I), a second repeating unit having a structure represented by Formula (II), and a third repeating unit having a structure represented by Formula (III):

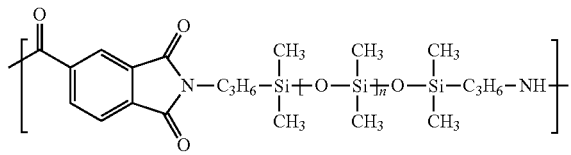

Formula (I)

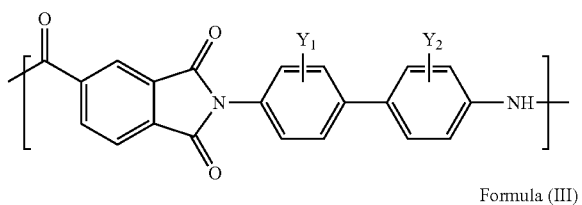

Formula (II)

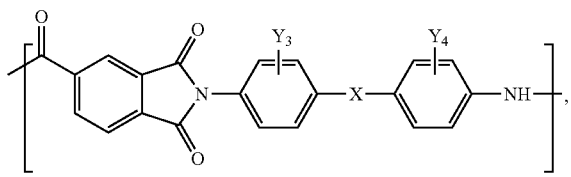

Formula (III)

wherein $Y_1$ and $Y_2$ are independently —H, —$CH_3$, or —$CH_2CH_3$; n is an integer ranging from 1 to 25; the molar ratio of the first repeating unit to the second repeating unit is from 5:95 to 15:45; and, $Y_3$ and $Y_4$ are independently —H, —$CH_3$, or —$CH_2CH_3$; X is —$CH_2$—, —$C(CH_3)_2$—, or —O—; and the molar ratio between the first repeating unit, the second repeating unit, and the third repeating unit is from 5:90:5 to 15:45:30.

2. The polymer as claimed in claim 1, wherein the polymer has a number average molecular weight of from 8,000 to 15,000.

3. The polymer as claimed in claim 1, wherein there are between 1 and 40 first repeating units, and there are between 1 and 40 second repeating units.

4. The polymer as claimed in claim 1, wherein there are between 1 and 40 first repeating units, there are between 1 and 40 second repeating units, and there are between 1 and 40 third repeating units.

5. The polymer as claimed in claim 1, further comprising a fourth repeating unit having a structure represented by Formula (IV)

Formula (IV)

wherein the molar ratio between the first repeating unit, the second repeating unit, the third repeating unit and the fourth repeating unit is from 5:85:5:5 to 15:45:30:10.

6. The polymer as claimed in claim 5, wherein the polymer has a number average molecular weight of from 8,000 to 15,000.

7. The polymer as claimed in claim 5, wherein there are between 1 and 40 first repeating units; there are between 1 and 40 second repeating units; there are between 1 and 40 third repeating units; and there are between 1 and 40 fourth repeating units.

8. A resin composition, comprising:
   100 parts by weight of the polymer as claimed in claim 1; and
   10-70 parts by weight of epoxy resin selected from a group consisting of a compound having a structure represented by Formula (V-I) and a compound having a structure represented by Formula (V-II)

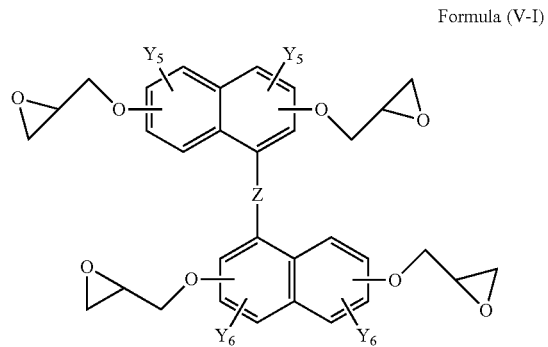

Formula (V-I)

-continued

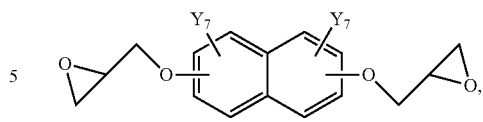

Formula (V-II)

wherein $Y_5$ and $Y_6$ are independently —H, —$CH_3$, or —$CH_2CH_3$; Z is —$CH_2$—, —$C(CH_3)_2$—, or —O; and $Y_7$ is —H, —$CH_3$, or —$CH_2H_3$.

9. The resin composition as claimed in claim 8, further comprising a solvent.

10. The resin composition as claimed in claim 8, further comprising an inorganic powder which is present in an amount equal to or less than 50 parts by weight.

11. The resin composition as claimed in claim 10, wherein the inorganic powder has an average particle size from 5 μm to 12 μm.

12. The resin composition as claimed in claim 10, wherein the inorganic powder comprises silicon oxide, aluminum oxide, magnesium oxide, or a combination thereof.

\* \* \* \* \*